(12) United States Patent
Kurano et al.

(10) Patent No.: US 6,227,926 B1
(45) Date of Patent: May 8, 2001

(54) CONSTRUCTION OF ELECTRODE FOR HIGH PRESSURE DISCHARGE LAMP AND PROCESS FOR PRODUCING THE SAME

(75) Inventors: Masahiro Kurano; Akiyoshi Fujimori, both of Chofu (JP)

(73) Assignee: Orc Manufacturing Co., Ltd., Tokyo (JP)

(*) Notice: Subject to any disclaimer, the term of this patent is extended or adjusted under 35 U.S.C. 154(b) by 0 days.

(21) Appl. No.: 09/526,883

(22) Filed: Mar. 16, 2000

Related U.S. Application Data

(62) Division of application No. 09/131,374, filed on Aug. 7, 1998.

(30) Foreign Application Priority Data

Oct. 3, 1997 (JP) .................................................. 9-271121

(51) Int. Cl.⁷ .................................................. H01J 9/04
(52) U.S. Cl. .................................................. 445/51; 445/58
(58) Field of Search .................................. 445/58, 50, 51

(56) References Cited

U.S. PATENT DOCUMENTS

| | | | |
|---|---|---|---|
| 3,248,591 | * 4/1966 | Arndt | 313/40 |
| 4,404,895 | * 9/1983 | Courvoisier et al. | 75/325 |
| 4,906,895 | * 3/1990 | Pabst et al. | 313/532 |
| 5,629,585 | * 5/1997 | Altmann et al. | 313/570 |
| 5,929,565 | * 7/1999 | Mayama et al. | 313/631 |

* cited by examiner

*Primary Examiner*—Kenneth J. Ramsey
(74) *Attorney, Agent, or Firm*—Liniak, Berenato, Longacre & White, LLC

(57) ABSTRACT

In a construction of electrode for a high pressure discharge lamp used with maintaining a high input of electricity, which discharge lamp comprises a valve composed of a luminescence tube having a swelled portion at the middle thereof, and an anode and a cathode placed opposite to each other, the cathode is composed of a metal with a high melting temperature doped with a electron-emitting substance and having a tapered portion toward the discharge side, the slope portion of said tapered portion being subjected to carburization at said tapered portion, and a non-treated portion being formed at the edge of the tapered portion continuous to the carburized portion.

1 Claim, 6 Drawing Sheets

A

B

CONSTRUCTION OF ELECTRODE FOR HIGH PRESSURE DISCHARGE LAMP AND PROCESS FOR PRODUCING THE SAME

This application is a divisional of Ser. No. 09/131,374 filed on Aug. 7, 1998; Now pending.

DETAILED DESCRIPTION OF THE INVENTION

1. Field of the Invention

The present invention relates to an electrode for a high pressure discharge lamp which is used with maintaining a high input of electricity and a process for the producing the same. More particularly, the invention is concerned with a construction of an electrode which can easily be designed and which can be used over aprolong period of time in a stable manner, and the process for producing the same.

2. Description of the Prior Art

In general, in the case of forming a pattern for wiring a semiconductor, a high input discharge lamp, which irradiates a ultraviolet ray, is used as a light source. For applying such a discharge lamp to an exposing area, e.g., of a semiconductor wafer, or of a liquid crystal panel, whose size has been enlarged, and to an exposing pattern, which has been miniaturized, it has been known that a flash light manner is utilized, in which low input and high input are alternatively repeated and exposure is carried out at the time of high input.

Also, a short arc type mercury discharge lamp has been suggested to be applied to a miniaturized exposing pattern, which utilizes a large electric current and a decreased amount of mercury incorporated in the discharge lamp so that an i-ray, which is a mercury luminescent line having a narrow half band width, is effectively emitted.

The construction of the prior art discharge lamp, however, has the following disadvantages: In the case of the discharge lamp in a flash light manner or the discharge lamp utilizing large electric current, the cathode undergoes severe damage during the course of discharge, the cathode is significantly consumed, and due to the consumption of the cathode, the tube wall of the discharge lamp is blacken. What is worse, due to the deformation, the distance between the anode and the cathode is changed to thereby change the position of arc discharge, making it impossible to be used as the discharge lamp.

Further, in the flash light manner, due to a vast change in the arc strength discharged between the cathode and the anode, defective exposure occurs, and the unstable state of the arc can be controlled only with difficulty. Furthermore, the power supply for use in controlling the arc to be stable, has a complicated structure, and expensive.

A method has been known from German Patent Application No. P 3723271.1, in which a porous membrane made of, e.g., a carbide, is covered with a portion of the cathode except for the edge portion in such a manner that the thickness of the membrane is gradually decreased as being closer to the edge portion to suppress the consumption of the cathode. However, this method which involves the operation of treating the cathode at a prescribed site and a step of releasing the absorbed gas of the cover, requires a lot of effort and the operation thereof is complicated.

Moreover, a method has also been known from Japanese Laid-Open Patent Application No. 4-137349, in which a dispersion of carbon powder is applied to the cathode to form a carbonized portion on the cathode. However, since the carbonization is carried out in the state where the dispersion of carbon powder is applied on the surface of the cathode to be used as the cathode in this method, the carbon which is formed on the surface of the cathode is scattered during the course of lighting the discharge lamp, and has an adverse affect. Impurities (e.g., potassium and oxides on the surface of the carbon) contained in the carbon adhered onto the cathode shortens the service life of the discharge lamp.

SUMMARY OF THE INVENTION

The present invention is devised in order to solve the problems described above, and an object of the present invention is to provide a construction of electrode for a high discharge lamp, which can suppress the consumption and the damage of the cathode as little as possible even if the discharge lamp is used at a large amount of current, whereby the lighting of the discharge lamp can be continued over a prolong period of time in a stable state. Another object of the present invention is to provide a process for producing an electrode for a discharge lamp, which can produce the cathode with ease, in which the controlling portion of the power source can be simplified and in which a treatment with carbon can be carried out without adversely affecting with a service life of the discharge lamp. Still another object of the present invention is to provide a construction of electrode for a high discharge lamp which can be used for a longer period of time by subjecting the anode to carburization.

The present invention which solves the above problems is a construction of electrode for a high pressure discharge lamp used with maintaining a high input of electricity, which discharge lamp comprises a valve composed of a luminescence tube having a swelled portion at the middle thereof, and an anode and a cathode placed opposite to each other, said cathode being composed of a metal with a high melting temperature doped with a electron-emitting substance and having a tapered portion toward the discharge side, the slope portion of said tapered portion being subjected to carburization at said tapered portion, and a non-treated portion being formed at the edge of the tapered portion continuous to the carburized portion.

The cathode may be composed of the tapered portion and a cylindrical portion continuous thereto, and the carburized portion is formed from the tapered portion to a prescribed portion of the cylindrical portion.

It is also advantageous that the anode comprises a non-treated portion at the edge thereof and a carburized portion formed by carburization continuous to said non-treated portion.

The carburized portion may have a uniform thickness and/or may be fromed within the metal.

The present invention also relates to a process for producing an electrode for a high pressure discharge lamp comprising the following steps:

a first step for applying an applying liquid comprising a sintered medium having graphite incorporated therein to a cathode or both of the cathode and anode for a discharge lamp at the position except for the edge portion and drying the medium, a second step for carrying out a previous heat treatment of the applying liquid in vacuo at a temperature appropriate to removing the impurities contained in the applying liquid to remove the impurities, a third step for heating the applying liquid at a temperature appropriate to sintering the applying liquid in an inert gas to sinter the sintering medium onto the electrode, a fourth step for removing the sintered applying medium, and a fifth step for heating the electrode, from which the applying medium has been removed, in vacuo at a carbonization temperature appropriate to obtaining a desired depth of the carbonized layer.

DESCRIPTION OF PREFERRED EMBODIMENT

Figure 1:
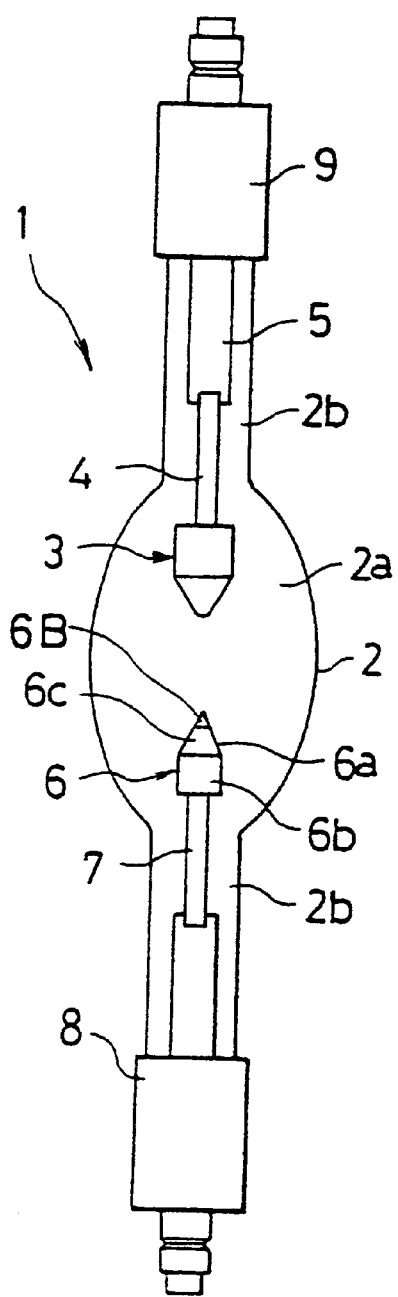
FIG. 1A is a front view showing the whole construction of the high pressure discharge lamp.
FIG. 1B is a front view in which the electrode portion of the high pressure discharge lamp is elongated and a partly sectional front view of the same.
Figure 1:
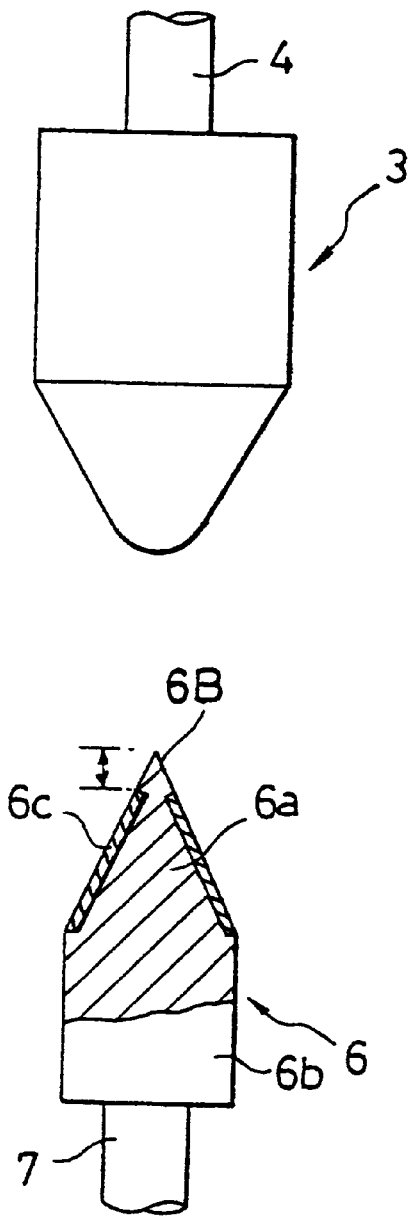

One embodiment of the present invention will now be described by referring to the drawings.

Figure 2:
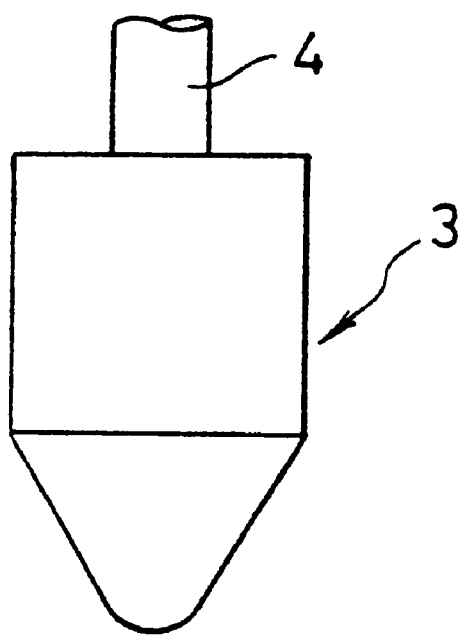
FIG. 2 is an enlarged front view showing the electrode part of the high pressure discharge lamp according to another embodiment.
Figure 2:
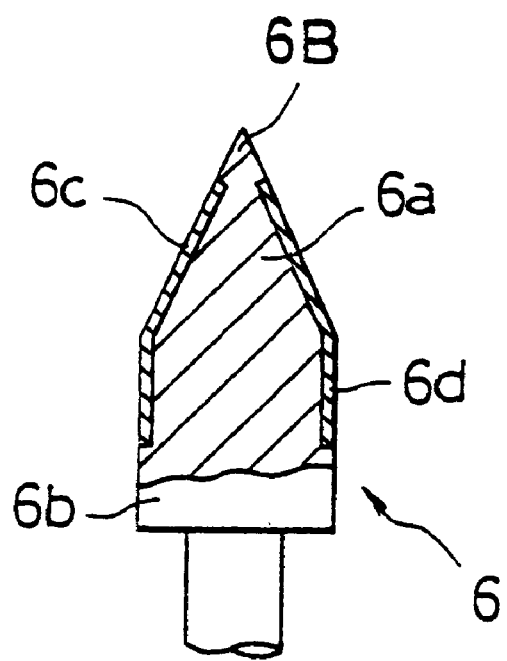
Figure 3:
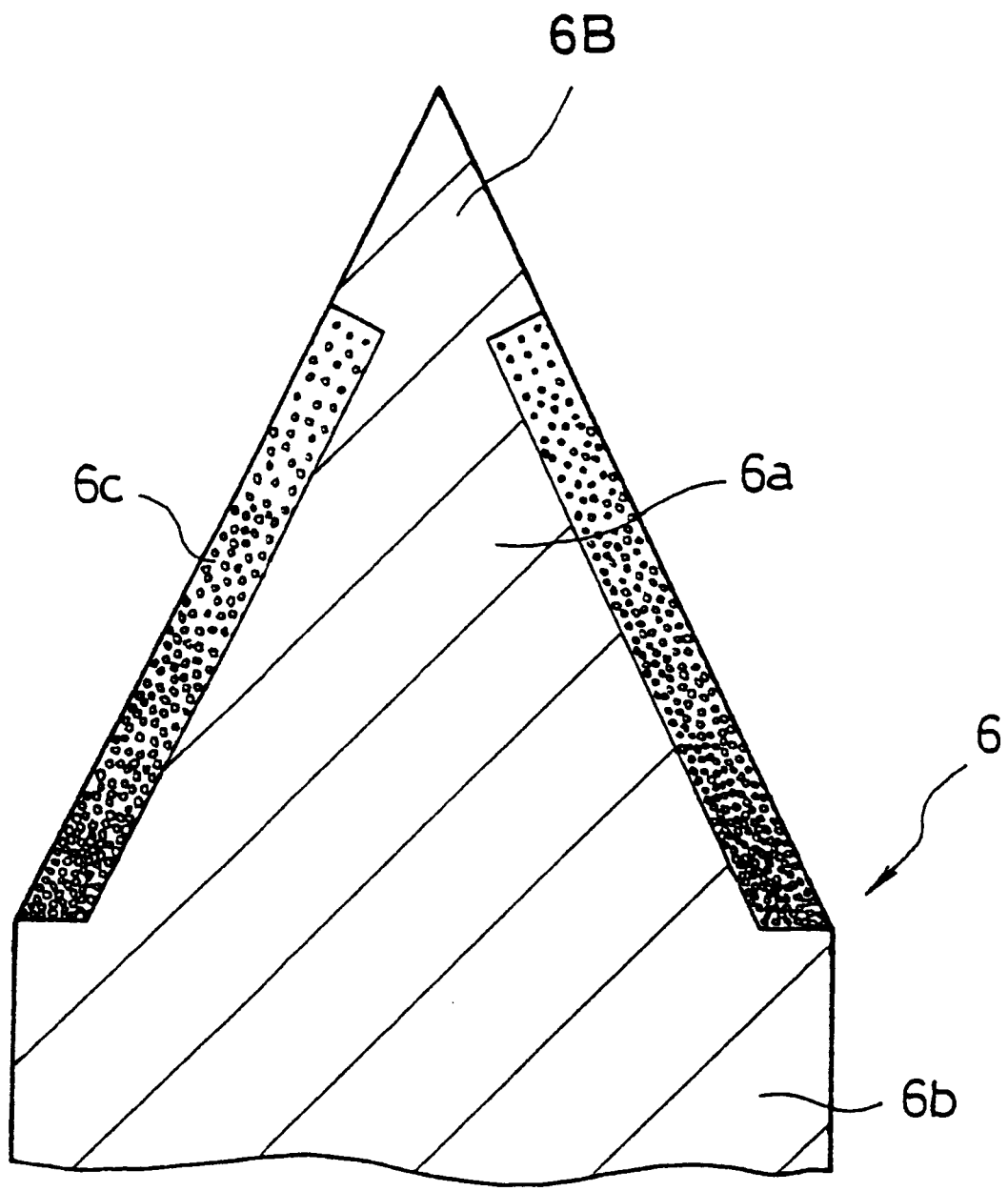
FIG. 3 is a drawing showing the principal of the electrode part of the high pressure discharge lamp according to still another embodiment.
Figure 5:
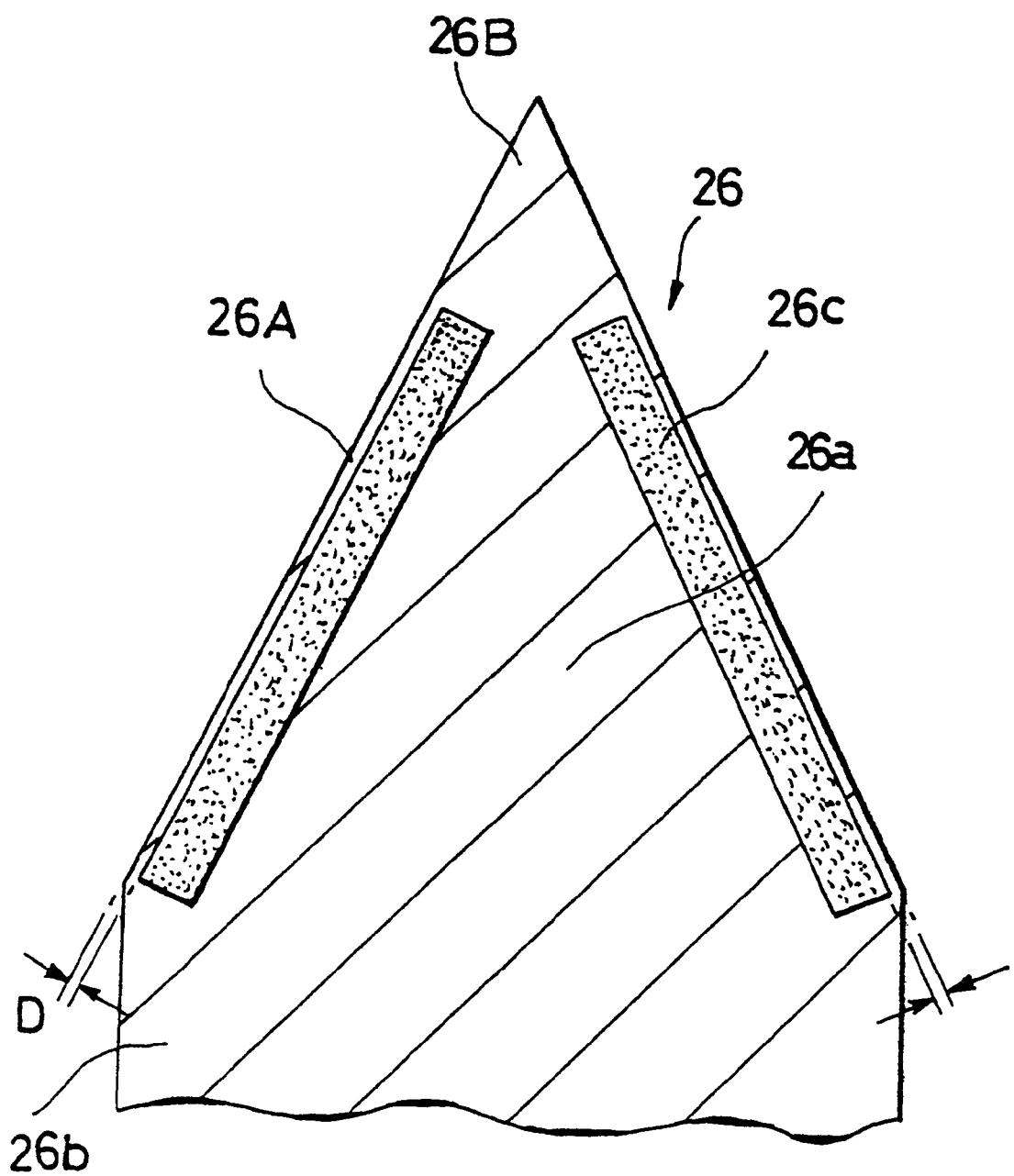
FIG. 5 is a drawing showing the principal of the electrode according to another embodiment of the present invention.
Figure 6:
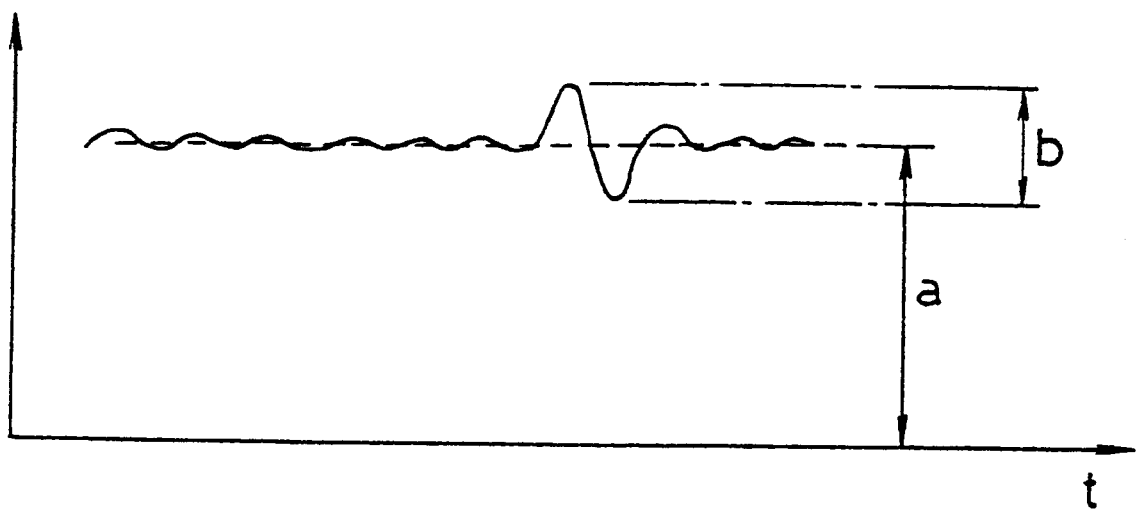
FIG. 6 is a graph showing the coefficient of variation of the discharge lamp.

FIG. 1A is a front view showing the whole construction of the high pressure discharge lamp, FIG. 1(b) is a front view in which the electrode portion of the high pressure discharge lamp is elongated and a partly sectional front view of the same. FIG. 2 is an enlarged front view showing the electrode part of the high pressure discharge lamp according to another embodiment. FIG. 3 is a drawing showing the principal of the electrode part of the high pressure discharge lamp according to still another embodiment. FIGS. 4A and B are a front view showing a whole construction of the high pressure discharge lamp according to further embodiment and an enlarged front view showing the electrode part thereof, respectively. FIG. 5 is a drawing showing the principal of the electrode according to another embodiment of the present invention. FIG. 6 is a graph showing the coefficient of variation of the discharge lamp.

As shown in FIG. 1A, a short arc type high pressure discharge lamp 1 is composed of a valve 2, an anode 3 and a cathode 6 placed opposite to each other within the valve 2, clasps 8 and 9 provided on the both ends of the valve 2. High pressure lamps applicable to the electrode construction according to the present invention are those which use a high consumption electric power ranging from 1,000 W to 7,000 W. In this embodiment, a high pressure lamp 1 whose consumption electric power is approximately 1,750 W.

The valve 2 has a swelled portion at the middle thereof, and is composed of a luminescence tube 2a, and sealing tubes 2b and 2b extending in the cylindrical form placed on the both sides of the luminescence tube 2a. In the valve 2, a prescribed amount of mercury is incorporated and, at the same time, an inert gas which has a prescribed pressure at normal temperature is incorporated. Also, within the luminescence tube 2a of the valve 2, the anode 3 and cathode 6 are placed in the state where they are opposite to each other at a constant distance.

As shown in FIG. 1B, the cathode 6 is made of a metal having a high melting temperature, represented by tungsten, and is formed of a tapered portion 6a having a conical form, a cylindrical portion 6b which is linked to the tapered portion 6a, and a carburized portion 6c formed by carburizing the tapered portion 6a except for the edge portion thereof. A metal foil 5 is connected to the cylindrical portion 6b via a supporting member 7. The metal foil 5 is typically made of molybdenum.

The cathode 6 is previously doped with an electron-discharging substance such as thorium dioxide. Irrelevant to the diameter of the tapered portion 6a, the carburized portion of the cathode is substantially formed at a constant thickness, and the carburized layer is formed from the surface of the cathode to the interior of the cathode. Alternatively, the carbutized layer having a thickness of from several microns to several ten microns is formed within the cathode.

The length of the non-treated portion 6B depends upon the electric power applied to the electrode and the non-treated portion 6B is a portion having extreme increase in temperature due to the arc discharge generated between the electrodes.

The term "carburization" used herein means the treatment in which an amount of the carbon on the metal surface of the electrode or within the metal of the electrode is increased, and is distinguished from the carbonization described in the prior art in which the cover of the carbonized layer is merely provided on the surface of the electrode. As for the depth and dimension of the carburized layer formed on and/or within the cathode should not be specially restricted, as long as they can prevent impurities from being absorbed or adhered on the surface of the cathode.

The carburized portion 6c of the cathode 6 is formed in a constant thickness irrelevant to the diameter of the projecting portion 6a.

Although the method for forming the carburized portion 6c which is not specially restricted, for example, the following method is applicable.

[$1^{st}$ Step: Applying and Drying Applying Medium]

An applying medium (liquid) having graphite incorporated in a sintering medium such as alkaline water glass or ceramic is applied to the tapered portion 6 a except for the non-treated portion 6B thereof, and then it is spontaneously dried. Preference is given to use a water glass having approximately 10% by weight of potassium silicate as a sintering medium incorporated in water, but inorganic substances such as ceramics may be utilized as the sintering medium. The use of potassium silicate is effective for separating out the solid substance sintered during the sintering treatment described later on.

[$2^{nd}$ Step: Preheating Applying Liquid]

Subsequently, the cathode 6 to which the spontaneously dried applying medium is adhered is heated, at a temperature appropriated for separating out impurities contained in the applying medium (e.g., at approximately 800° C. for degassing, in the case of using the above-mentioned water glass containing, approximately 10% by weight of potassium silicate) over a period of approximately 15 minutes in vacuo, e.g., at a reduced pressure of $5 \times 10^{-5}$ Torr. The heat conditions in this step such as a heating temperature, a heating temperature, and a vacuum degree, depend upon the concentration of the potassium silicate if contained, the kind and the concentration of the sintering medium used. The preheating is carried out under the conditions appropriate to the applying medium to be used to separate out the impurities. In general, the preheating is preferably carried out at a temperature of from 600° to 1,000° C., for 5 to 30 minutes.

[3$^{rd}$ Step: Sintering Treatment]

The sintering treatment is carried out in an inert gas) atmosphere such as argon (Ar) and xenon (Xe), for example, at a temperature of from 1,500° to 1,700° C. for 15 to 60 minutes. In the case of the above-mentioned which is an inert gas at such a temperature as to be a sintering temperature of the applying medium from which impurities contained therein are removed. In this case, the heat treatment is carried out at 1600° C. for approximately 30 minutes. The sintering temperature and sintering period depend upon the applying medium, and the sintering is carried out under the conditions where the sintering temperature and the sintering period are appropriate to the applying medium to be used.

[4$^{th}$ Step: Removal of Solid]

When the sintering is carried out as described above, the membrane formed on the cathode is completely sintered to be a solid. The solid is completely peeled off and removed from the cathode 6, for example, by means of a pair of tweezers. In this operation, the carbon is slightly carburized within the cathode 6.

[5$^{th}$ Step: Carburization]

Finally, corresponding to the thickness of the carbon-immersed layer to be carburized, the heat treatment in vacuo is carried out. In this case, the carburization is carried out by heating the applying medium at a temperature of approximately 1900° C. for a period of approximately 30 minutes. This carburization makes the carbon certainly disperse into the cathode 6 to thereby form the carburized portion 6c having a uniform thickness and, at the same time, the water glass which is the applying medium for the surface can be perfectly removed.

In carrying out the carburization, since the thickness of the carburized layer can be controlled by the heating temperature and the heating period, the thickness of the carburized layer can be controlled at a desired thickness. Consequently, the carbon-immersion can be carried out in a stable manner.

Accordingly, when the high pressure discharge lamp comprising the cathode 6 having a carbon-immersion portion 6c is utilized at an electric current as high as 1000 W or more), the thorium atom formed within the cathode 6 which is at a high temperature state due to the discharge disperses along the grain boundary to form a single-atom layer on the surface. This single-atom layer forms an electric double layer, which reduces the work function of the surface of the cathode 6. Further, at the position of the carbon-immersed portion 6c, the reduction of thorium is accelerated and, at the same time, the distillation of the thorium is suppressed.

As shown in FIG. 2, the cathode 6 is preferably composed of one carburized portion 6c placed at the tapered portion 6a and another carburized portion 6d placed at the cylindrical portion 6b formed continuously. As described above by possessing the carburized portion 6d on the cylindrical portion 6b, the stability is improved and, at the same time, the loss due to the consumption is suppressed as little as possible.

As shown in FIG. 3, when the carburized portion 6c is formed such that the distribution of the carbon becomes coarser toward the edge portion, the carburized portion 6c and the boundary of the edge portion are in complete harmony. In this case, the high pressure discharge lamp is excelling in strength, is of improved electric resistance and thermal conductivity and, thus, it can be used with much more stability.

In order to form the carburized portion 6c in the state as shown in FIG. 3, an alkaline water glass which is a sintering medium having different concentrations of graphite incorporated therein is applied to the cathode 6 except for the edge portion, and the sintering process described above is repeated.

Next, another embodiment of the present invention will now be described by referring to FIG. 5.

A high pressure discharge lamp 10 shows a mercury vapor discharge lamp of a short arc type whose consumption power is 5 KW. This high pressure discharge lamp 10 is made of a ultraviolet transmitting material such as quartz glass, and is composed of a valve 17 having a swelled portion 15 formed at the middle thereof and sealing tubes 16 and 16 placed on the both ends of the swelled portion 15, and an anode 13 and a cathode 11 placed within the luminescence space opposite to each other, etc.

Clasps 8 and 9 are placed on the ends of the sealing tube 16 and 16, and a space between the clasps 8 or 9 and the poles 11 and 13 is connected to a molybdenum foil (not shown) having a thickness of approximately 0.02 mm.

In the valve 17, mercury and xenon gas or argon gas, the latter acting as an inert gas, are incorporated.

The anode 13 is made of tungsten, and at the center of the flat edge portion 14, a spherical concavity 20 is placed. For example, the concavity 20 has a diameter of 10 mm, and the depth of 2 mm. The distance between the anode 13 and the cathode 11 is 4 mm.

On the side portion of the anode 13, a carburized portion 13a, which has been subjected to carburization is formed, in such a manner that the thickness thereof is even. In the case of the cathode 11, a carburized portion 11c is formed on the projecting portion 11a thereof except for the edge portion 11a. The method of forming the carburized portion 11c is omitted, because it is the same as that described in FIG. 1.

In the embodiments shown in FIGS. 1 to 4, the carburized portion is formed on the surface of the metal of the cathode. However, as shown in FIG. 5, the carburized portion may be within the metal. To be specific, as shown in FIG. 5, a non-treated portion 26B is formed at the edge of the tapered portion 26a, and a carburized portion 26c is formed at the tapered portion continuous to the edge. The carburized portion 26c described above is formed along the slope of the tapered portion 26a of the cathode 26 and into the slope at the distance D (e.g., approximately 3 $\mu$m). Consequently, the carburized portion 26c is not exposed on the surface 26A of the electrode.

In this case, the carburized portion 26c can be formed by carrying out the process according to the present invention described previously, provided that the carburization treatment is carried out at a higher temperature for a longer period (e.g., at approximately 2,000° C. for 60 minutes). In the embodiment described in FIG. 5, the carburized portion 26c is formed within the tapered portion 26a of the cathode, but it should be understood that various embodiment can be applicable in which a carburized portion is also formed within the cylindrical portion and/or in which carburized portions of anode and the cathode are formed within the metals of electrodes.

The length of the non-treated portion 26B depends upon the electric power applied to the electrode and the non-treated portion 6B is a portion having extreme increase in temperature due to the arc discharge generated between the electrodes (In this case, the length is approximately 4 mm).

EXAMPLES

The present invention will now be described by referring to Examples and Comparative Examples. However, it should be noted that the present invention is not restricted thereto.

Examples 1 and 2 and Comparative Examples 1 to 3

(Production of Electrode)

An edge of a cylindrical alloy having diameter of 6 mm and a length of 100 mm comprising 98% by weight of tungsten and 2% by weight of thorium dioxide is cut into a cone to produce a cathode. To the cathode was applied an aqueous carbon dispersion containing approximately 10% by weight of potassium silicate at the position 3 mm from the edge to 11 mm from the edge, and spontaneously dried. After drying, the applied portion was pretreated at a temperature of 800° C. at a vacuum degree of $5\times10^{-5}$ Torr over a period of 15 minutes to carry out degassing of the aqueous dispersion in vacuo, after which a sintering treatment was carried out at approximately 1,600° C. for 30 minutes in an Ar atmosphere. This sintered and solidified the film covered on the cathode. The solid was completely peeled out of the cathode by means of a pair of tweezers. In this treatment, it was observed that the carbon was slightly carburized on the surface of the cathode. The curburization was further carried out at a temperature of approximately 1,900° C. at a vacuum degree of $5\times10^{-5}$ Torr over a period of 30 minutes to secure the carburization of the cathode from the surface to approximately 3 $\mu$m depth. This made a cathode of Example 1 having a carburized portion.

The cathode having not been treated was used as a cathode for Comparative Example 1.

The untreated cathode was treated as described in German patent Application P. 3723271.1 to produce a cathode for Comparative Example 2.

The untreated cathode was treated as described in Japanese patent Laid-Open publication No. 4-137349 to produce a cathode for Comparative Example 3.

(Production of Anode)

As for Example 1 and Comparative Examples 1 to 3, an anode made of pure tungsten was used. In Example 2, the anode made of pure tungsten described above was carburized as in the case of the cathode.

(Production of High Pressure Discharge Lamp)

The cathodes and anodes produced as in Examples 1 and 2 and Comparative Examples 1 to 3 were placed on the high pressure discharge lamp as shown in FIG. 1 opposite to each other. The conditions of operating the high pressure discharge lamps obtained as described above were examined as follows.

Approximately constant power of 1750 W was continuously inputted to the high pressure discharge lamp to examine the service life of the lamp, the variation in the arc strength as shown in FIG. 6 and defined in the following formula (1), the maintenance ratio of the horizontal ultraviolet illumination taking the initial ultraviolet illumination as 100%, and the maintenance ratio of the ultraviolet orientation integrated value. The electric current applied was approximately 70 A. Variation of the average arc strength:

The light discharged from the high pressure lump is in proportion to the strength of the arc, and this light contains several fluctuations. The degree of fluctuation is changed and varied as shown in FIG. 6. The average of the arc strength is defined as an "average arc strength" and the variation of the average arc strength is calculated by the following formula (1):

$$\text{Variation of average arc strength} = b/a \times 100(\%)$$

wherein a represents an average arc strength, and b represents the maximum variation width of the arc strength.

The variation of average arc strength is an index showing that as the value is lower, the discharge lamp runs more stably.

The maintenance ratio of the horizontal ultraviolet illumination relative to and maintenance ratio of the ultraviolet orientation integrated value:

A lamp becomes darker as it is used for a longer period of time. As the methods for quantitatively determining the degree of darkening, a maintenance ratio of horizontal ultraviolet illumination relative to the initial ultraviolet illumination and a maintenance ratio of the ultraviolet orientation integrated value are used.

The maintenance ratio of horizontal ultraviolet illumination relative to the initial ultraviolet illumination is an index showing the aging of a lamp itself, and means the maintenance ratio of the illumination determined how the lamp used maintains an illumination in the horizontal direction in comparison with that of the unused lamp. The value nearer 100% is better.

Lights radiated from the lamp are not only in the horizontal direction, but also in all directions. The maintenance ratio of the illumination of lights radiated in all directions is called a maintenance ratio of the ultraviolet orientation integrated value. For example, when the flushing point of the high pressure discharge lamp is placed to the first focusing point of an elliptic mirror, all of radiated lights can be collected (referred to as light collection or light integration). The maintenance ratio of the ultraviolet orientation integrated value means the maintenance ratio of illumination of lights collected to the second focusing point. In this case, the wavelength of the ultraviolet was determined to obtain the maintenance ratio of ultraviolet orientation integrated value. This is better as the value is nearer 100%.

TABLE 1

|  | Example 1 | Example 2 | Comparative Example 1 | Comparative Example 2 | Comparative Example 3 |
| --- | --- | --- | --- | --- | --- |
| Treatment of Cathode | Carburized | Carburized | None | according to GP 3723271.3 | according to JP4-137349 |
| Treatment of Anode | None | Carburized | None | None | None |
| Service life (hr.) | 1,500 | 1,500 | 400 | 750 | 750 |
| Variation (%) | 1% or less | 1% or less | 3% of more | 2–4% | 2–4% |
| Maintenance ratio Of horizontal Illumination (%) | 90% | 90% | 75% | 75% | 75% |
| Maintenance ratio Of UV illumination (%) | 80% | 85% | 70% | 70% | 70% |

As is clear from Table 1, the high pressure discharge lamps using the cathode having been carburized according to the present invention have been found to be outstanding service life in comparison with those using the conventional cathodes. The electrodes having been carburized according to the present invention have remarkably high maintenance ratios in comparison with the conventional electrodes, showing that the electrodes according to the present invention can light with stable illumination during the course of the service life. In particular, in the case of carburizing both of the cathode and the anode according to the present invention, the effects have been found to be significant.

Examples 3 and 4 and Comparative Examples 4–6

Figure 4:
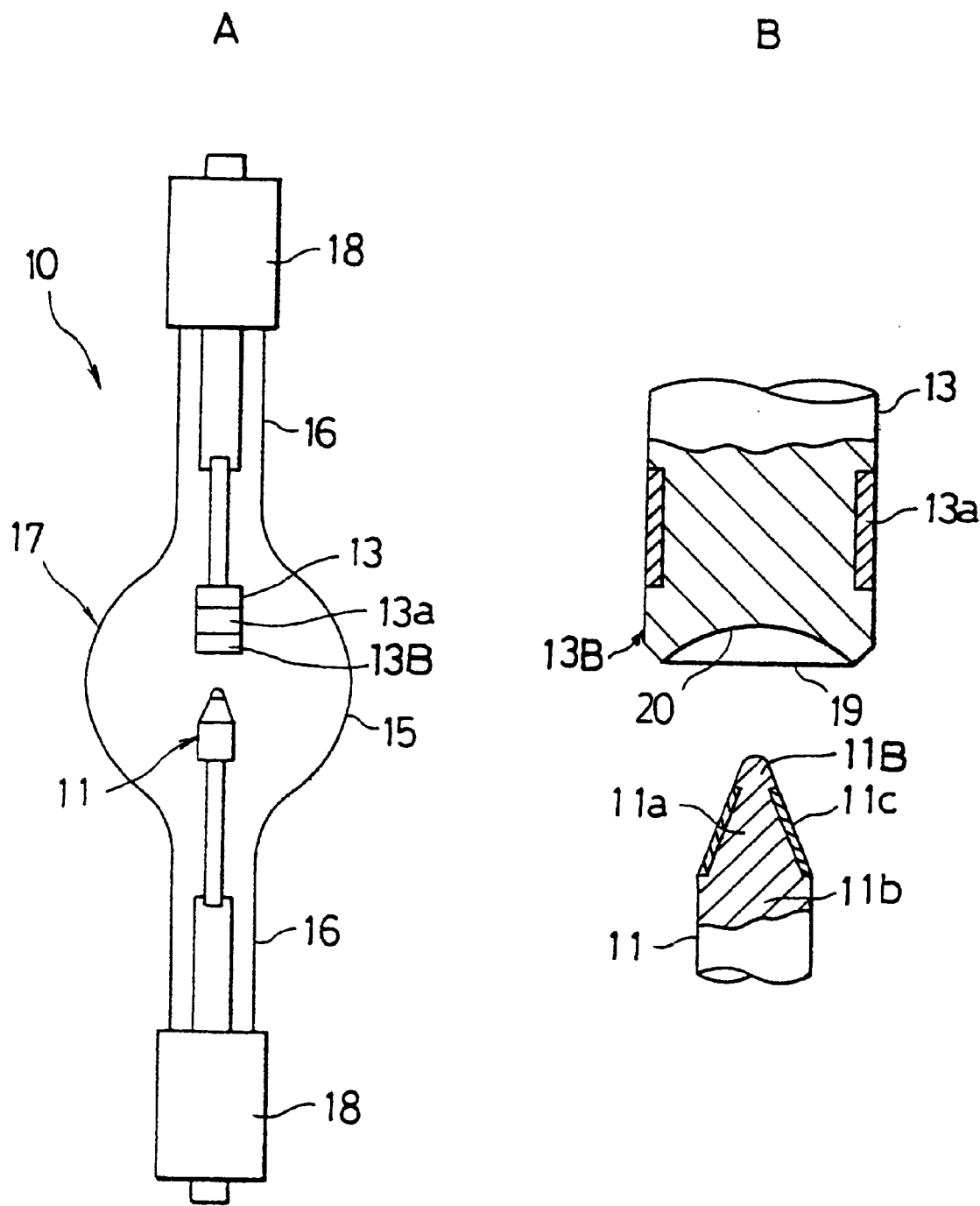
FIGS. 4A and B are a front view showing a whole construction of the high pressure discharge lamp according to further embodiment and an enlarged front view showing the electrode part thereof, respectively.

These Examples and Comparative Examples are relates to the electrodes for the 5 KW short arc type discharge lamp shown in FIG. 4. The cathodes were treated as in Examples 1 and 2 and Comparative Examples 1 to 3, except that a cathode comprising 98% by weight of tungsten and 2% by weight of thorium dioxide having a diameter of 12 mm and a length of 100 mm in whose edge had been cut into a cone. As an anode, a pure tangsten having a concave portion with 10 mm in diameter and 2 mm in depth was used. in Examples 3 and Comparative Examples 4 to 6, the anode was not treated, but in Example 4, the anode was treated as in Example 2.

The cathode and the anode each obtained in Examples 3 and 4 and Comparative Examples 4 to 6 were placed in the high pressure discharge lamp shown in FIG. 5 opposite to each other at the distance of 4 mm, and approximately 40 mg/cc of mercury was incorporated in the lamp, and the discharge current was 100 A. The conditions of operating lamp was examined as in Examples 1 and 2 and Comparative Examples 1 to 3, the results as in these Examples and Comparative Examples were obtained. The service lives were 750 hours for Example 3 in which only the cathode was carburized, 1000 hours for Example 4 in which both electrodes were carburized, 250 hours for Comparative Example 4 in which no treatment was done, 400 hours for Comparative Example 5 in which the cathode was treated according to the above-mentioned German Patent Application, and 400 hours for Comparative Example 6 in which the cathode was treated according to the above-mentioned Japanese Patent Publication.

As is clear from these results, the high pressure discharge lamps using the cathode having been carburized according to the present invention have been found to possess outstanding service life and that they can light with stable illumination during the course of the service life. In particular, in the case where both electrodes were carburized, the effects were remarkable.

As described previously, the present invention has the following advantageous effects:

By carburization of a cathode of a high pressure discharge lamp except for the edge portion, when the discharge lamp can be turned on while maintaining a large amount of electric current, the consumption and damage of the cathode can be suppressed as little as possible. Further, the discharge lamp can be used over a prolong period of time with a stable variation ratio (arc stability).

When carburized portion is provided on the projecting portion and the cylindrical portion of the cathode, the discharge lamp can be used over a prolong period of time with more stable variation ratio. In addition, when the cathode is subjected to carburization, the discharge lamp can be used over a prolong period of time with a stable variation ratio even when running a large amount of electric current.

Since the carburized layer can easily be formed with a constant thickness, the controlling the carburization and the regulation thereof can easily be carried out.

Furthermore, in the case where a carbon-immersion portion is formed on at least either of the cathode and anode, by using an applying medium, which is sintered, removing the applying medium, and then carrying out carburization, a high pressure discharge lamp can be produced, in which the consumption and damage of the electrode are suppressed as little as possible, and which can be used over a prolong period of time with a stable variation ratio.

What is claimed is:

1. A process for producing an electrode for a high pressure discharge lamp comprising the following steps:

a first step for applying an applying liquid comprising a sintered medium having graphite incorporated therein to a cathode or both of the cathode and anode for a discharge lamp at the position except for the edge portion and drying the medium, a second step for carrying out a previous heat treatment of the applying liquid in vacuo at a temperature appropriate to removing the impurities contained in the applying liquid to remove the impurities, a third step for heating the applying liquid at a temperature appropriate to sintering the applying liquid in an inert gas to sinter the sintering medium onto the electrode, a fourth step for removing the sintered applying medium, and a fifth step for heating the electrode, from which the applying medium has been removed, in vacuo at a carbonization temperature appropriate to obtaining a desired depth of the carbonized layer.

* * * * *